US012666890B2

(12) United States Patent
Kou et al.

(10) Patent No.: US 12,666,890 B2
(45) Date of Patent: Jun. 23, 2026

(54) METHOD OF DEPOSITING CONDENSABLE MATERIAL ONTO A SURFACE OF A SUBSTRATE

(71) Applicant: ASM IP Holding B.V., Almere (NL)

(72) Inventors: Hiroshi Kou, Tokyo (JP); Hideaki Fukuda, Hachioji (JP)

(73) Assignee: ASM IP Holding B.V., Almere (NL)

( * ) Notice: Subject to any disclaimer, the term of this patent is extended or adjusted under 35 U.S.C. 154(b) by 384 days.

(21) Appl. No.: 18/218,221

(22) Filed: Jul. 5, 2023

(65) Prior Publication Data

US 2024/0014033 A1    Jan. 11, 2024

Related U.S. Application Data

(60) Provisional application No. 63/359,319, filed on Jul. 8, 2022.

(51) Int. Cl.
*H01L 21/02* (2006.01)
*C23C 16/34* (2006.01)
*H10P 14/60* (2026.01)
*H10P 14/694* (2026.01)

(52) U.S. Cl.
CPC ........ *H10P 14/6682* (2026.01); *C23C 16/345* (2013.01); *H10P 14/6336* (2026.01); *H10P 14/6339* (2026.01); *H10P 14/69433* (2026.01)

(58) Field of Classification Search
None
See application file for complete search history.

(56) References Cited

U.S. PATENT DOCUMENTS

| | | | |
|---|---|---|---|
| 7,622,369 B1 | 11/2009 | Lee | |
| 7,718,553 B2 | 5/2010 | Fukazawa | |
| 7,825,040 B1 | 11/2010 | Fukazawa | |
| 8,765,233 B2 | 7/2014 | Fukazawa | |
| 9,190,263 B2 | 11/2015 | Dai | |
| 10,388,513 B1 | 8/2019 | Blanquart | |
| 10,483,099 B1 | 11/2019 | Blanquart | |
| 10,580,645 B2 | 3/2020 | Shinya | |
| 10,755,922 B2 | 8/2020 | Blanquart | |
| 10,755,923 B2 | 8/2020 | Blanquart | |
| 11,482,412 B2 | 10/2022 | Blanquart | |
| 11,626,316 B2 | 4/2023 | Utsuno | |
| 11,646,197 B2 | 5/2023 | Blanquart | |
| 2017/0137943 A1* | 5/2017 | Mohn | ............... H01L 21/68764 |
| 2020/0243323 A1* | 7/2020 | Kalutarage | ........... C23C 16/505 |
| 2020/0373152 A1 | 11/2020 | Blanquart | |
| 2021/0238742 A1 | 8/2021 | Susa | |
| 2022/0076996 A1 | 3/2022 | Blanquart | |
| 2022/0122841 A1 | 4/2022 | Blanquart | |
| 2022/0251707 A1 | 8/2022 | Susa | |
| 2022/0285211 A1 | 9/2022 | Färm | |
| 2022/0293463 A1 | 9/2022 | Vervuurt | |
| 2022/0336204 A1 | 10/2022 | Miyama | |

(Continued)

*Primary Examiner* — Asok K Sarkar
(74) *Attorney, Agent, or Firm* — Snell & Wilmer L.L.P.

(57) ABSTRACT

Methods of depositing material onto a surface of a substrate. Exemplary methods include flowing a gas-phase precursor within the reaction chamber, condensing the precursor onto the surface of the substrate to form condensed material, and curing the condensed material to transform the condensed material to cured material. The step of curing can be a plasma process and can include use of a reactant.

20 Claims, 5 Drawing Sheets

(56)          References Cited

U.S. PATENT DOCUMENTS

| | | |
|---|---|---|
| 2023/0030566 A1 | 2/2023 | Yoo |
| 2023/0043629 A1 | 2/2023 | Susa |
| 2023/0065627 A1 | 3/2023 | Blanquart |
| 2023/0095086 A1 | 3/2023 | Blanquart |
| 2023/0098575 A1 | 3/2023 | Dezelah |
| 2023/0101229 A1 | 3/2023 | Huotari |
| 2023/0115806 A1 | 4/2023 | Blanquart |

* cited by examiner

| Test # | 3 | 2 | 4 |
|---|---|---|---|
| Source purge (sec) | 0.3 | 1 | 5 |
| STEM | | | |

*Source feed time : 10sec

| Test # | 5 | 6 | 2 |
|---|---|---|---|
| RF Power (W) | 50 | 200 | 400 |
| STEM | | | |

*Source feed time : 10sec

| Test # | | 3 | 2 | 4 | 6 |
|---|---|---|---|---|---|
| Source purge (sec) | | 0.3 | 1 | 5 | 1 |
| RF Power (W) | | 400 | 400 | 400 | 200 |
| Component [5] | C | 28.1 | 25.5 | 23.3 | 20.8 |
| | N | 17.3 | 15.5 | 14.0 | 12.3 |
| | O | 29.3 | 32.8 | 35.4 | 37.9 |
| | Si | 1.6 | 0.3 | 0.7 | 3.7 |
| | Ti | 23.7 | 25.8 | 26.5 | 25.4 |

METHOD OF DEPOSITING CONDENSABLE MATERIAL ONTO A SURFACE OF A SUBSTRATE

CROSS-REFERENCE TO RELATED APPLICATIONS

This application claims priority to U.S. Provisional Patent Application Ser. No. 63/359,319 filed Jul. 8, 2022 titled METHOD OF DEPOSITING CONDENSABLE MATE-RIAL ONTO A SURFACE OF A SUBSTRATE, the disclo-sure of which is hereby incorporated by reference in its entirety.

FIELD OF INVENTION

The present disclosure generally relates to methods and systems for forming structures suitable for forming elec-tronic devices. More particularly, examples of the disclosure relate to methods and systems for forming layers by con-densing material on a surface of a substrate and curing the condensed material.

BACKGROUND OF THE DISCLOSURE

During the manufacture of electronic devices, it is often desirable to fill a gap with material. For example, depending on the application, it may be desirable to fill a gap with dielectric, semiconductive, or conducting material.

As device features continue to be reduced in size, an aspect ratio of a gap to be filled during formation of electronic devices can increase. As the aspect ratio of the gap increases, it becomes increasingly difficult to fill the gaps with material without forming significant voids and/or seams in the material that is deposited within the gap. Such voids and/or seams may be undesirable for a variety of reasons. For example, the void and/or seam can lead to undesired mechanical and/or electrical (e.g., dielectric, con-ducting) properties of the material within the gap and/or undesired variation in such properties.

Accordingly, improved methods of depositing material within a gap, while mitigating seam and/or void formation in the material deposited within the gap, are desired. Further, structures formed using such methods are also desired. Systems for performing the methods are also desired.

Any discussion of problems and solutions set forth in this section has been included in this disclosure solely for the purpose of providing a context for the present disclosure and should not be taken as an admission that any or all of the discussion was known at the time the invention was made.

SUMMARY OF THE DISCLOSURE

Various embodiments of the present disclosure relate generally to methods of depositing material onto a surface of a substrate, and more particularly, relate to methods of deposing material by condensing a precursor onto a surface of the substrate. Methods described herein can be used in a variety of applications, including gap-fill processes.

While the ways in which various embodiments of the present disclosure address drawbacks of prior methods and systems are discussed in more detail below, in general, various embodiments of the disclosure provide improved methods of deposing material within a gap with improved gap fill (e.g., less void and/or seam formation, particularly at a bottom of a gap). In addition, as set forth in more detail below, the deposited material may have a more desirable composition (e.g., less carbon) than material deposited using more typical techniques that rely on polymerization of a precursor in a gas phase to form a condensable material.

In accordance with examples of the disclosure, a method of depositing material onto a surface of a substrate includes providing the substrate onto a susceptor within a reaction chamber of a reactor, flowing a gas-phase precursor within the reaction chamber, condensing the precursor onto the surface of the substrate to form condensed material, and curing the condensed material to transform the condensed material to cured material. The substrate can include a surface that includes at least one gap. In accordance with aspects of these examples, the gas-phase precursor is heated to a temperature T1 prior to entering the gas-phase reactor—e.g., to maintain the gas-phase precursor as a gas. In accor-dance with further aspects, a temperature T2 of the susceptor during the step of condensing is less than T1. The condensed material can at least initially be a liquid prior to the step of curing. In accordance with yet further aspects, the con-densed material flows within the gap prior to the step of curing. The step of curing can include, for example, forming excited species that react with the condensed (e.g., liquid) material. The precursor can include, for example, one or more of silicon and a metal. By way of more particular examples, the precursor can include one or more of a metal halide, an alkylamino compound, and a methyl compound. In accordance with further examples, the method can include providing a plasma gas to the reaction chamber. The plasma gas can include an inert gas and/or a reactant. Exemplary reactants can include nitrogen ($N_2$), hydrogen ($H_2$), hydra-zine, a hydrazine derivative, and any combination thereof. In accordance with yet additional aspects, the step of curing includes forming a (e.g., direct) plasma using the plasma gas. In accordance with yet further aspects, a temperature of a wall of the reaction chamber can be controlled to a temperature T3, wherein T3 is greater than T2. T3 may desirably be above the condensation temperature of the precursor at a pressure within the reaction chamber. In accordance with further aspects, the gas-phase precursor comprises carbon. In such cases, the cured material com-prises less than 30 at % or less than 25 at % carbon. In accordance with yet further aspects, a deposition cycle including the steps of flowing the gas-phase precursor within the reaction chamber, condensing the precursor onto the surface of the substrate to form condensed material, and curing the condensed material to transform the condensed material to cured material can be repeated to fill a gap with relatively little or no seam and/or void formation.

In accordance with further embodiments of the disclosure, a structure is provided. The structure can be formed accord-ing to a method as set forth herein. The structure can include a substrate and one or more cured materials as described herein.

In accordance with yet additional examples of the disclo-sure, a system configured to perform a method and/or form a structure as described herein is provided.

These and other embodiments will become readily appar-ent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodi-ments of the present disclosure can be derived by referring to the detailed description and claims when considered in connection with the following illustrative figures.

Figure 1:
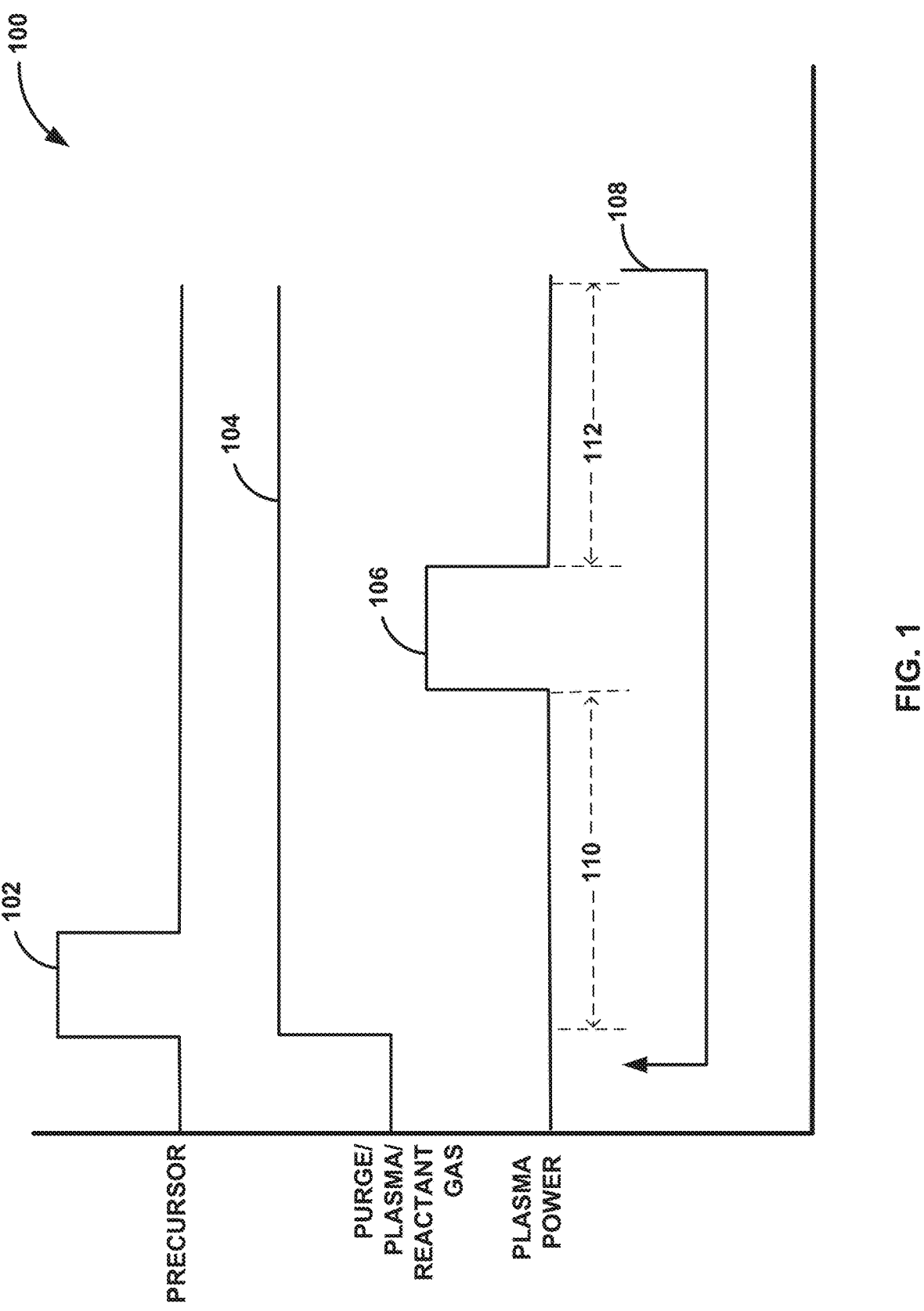
FIG. 1 illustrates a timing sequence of a method according to embodiments of the present disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of depositing material onto a surface of a substrate, to device structures including the deposited and/or cured material, and to systems for performing the methods and/or forming the structures. As described in more detail below, exemplary methods can be used to form structures suitable for forming electronic devices. For example, exemplary methods can be used to at least partially fill a gap with material. The material can include, for example, dielectric material, such as silicon nitride, conducting material, such as metal nitrides, or semiconductive material, such as, for example, silicon-containing material, such as amorphous silicon (a-Si).

Typical techniques to fill a gap with material can include providing a precursor to a reaction chamber and polymerizing the precursor (e.g., using a plasma) to form a polymerized material. The polymerized material then forms condensed material on the substrate surface. While such techniques may be suitable for some applications, material formed using such techniques may have undesirable properties and/or compositions (e.g., relatively high carbon content).

In accordance with various embodiments of the disclosure, a precursor condenses (without any initial plasma polymerization) onto a surface of a substrate. The condensed material can, at least initially, be a liquid. The (e.g., liquid) condensed material can flow within the gap prior to the step of curing. This allows relatively seamless and voidless material to form within the gap. After the precursor condenses onto the surface and flows within the gap, the condensed material is cured to form a solid material.

In this disclosure, gas may include material that is a gas at normal temperature and pressure, a vaporized solid and/or a vaporized liquid, and may be constituted by a single gas or a mixture of gases, depending on the context. A gas other than the process gas, e.g., a gas introduced without passing through a gas distribution assembly, such as a showerhead, other gas distribution device, or the like, may be used for, e.g., sealing the reaction space, and may include a seal gas, such as a rare or other inert gas. The term inert gas refers to a gas that does not take part in a chemical reaction to an appreciable extent and/or a gas that can excite or polymerize a precursor when plasma power is applied. In some cases, the terms precursor and reactant can be used interchangeably.

As used herein, the term substrate can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various features, such as recesses, lines, and the like formed within or on at least a portion of a layer of the substrate. By way of particular examples, a substrate can include features (e.g., gaps) having an aspect ratio of 3 or more or between about 2 and about 20.

In some embodiments, film refers to a layer extending in a direction perpendicular to a thickness direction to cover an entire target or concerned surface, or simply a layer covering a target or concerned surface. In some embodiments, layer refers to a structure having a certain thickness formed on a surface or a synonym of film or a non-film structure. A layer can be continuous or noncontinuous. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequences, and/or functions or purposes of the adjacent films or layers.

In this disclosure, continuously can refer to one or more of without breaking a vacuum, without interruption as a timeline, without any material intervening step, without changing treatment conditions, immediately thereafter, as a next step, or without an intervening discrete physical or chemical structure between two structures other than the two structures in some embodiments. For example, a plasma gas (e.g., an inert gas and/or reactant) can be supplied continuously during two or more steps and/or one or more cycles of a method.

The term cyclic deposition process or cyclical deposition process can refer to a method in which one or more of a flow of a precursor and a plasma power are pulsed. Exemplary cyclic deposition processes include techniques such as atomic layer deposition (ALD), cyclical chemical vapor deposition (cyclical CVD), and hybrid cyclical deposition processes that include an ALD component and a cyclical CVD component.

As used herein, the term purge may refer to a procedure in which an inert or substantially inert gas is provided to a reaction chamber. The inert or substantially inert gas can be provided continuously to the reaction chamber or can be pulsed—e.g., between pulses of a precursor and/or plasma pulses. For example, a purge may be provided between a precursor pulse and a plasma pulse, thus avoiding or at least minimizing gas-phase interactions between the precursor and an activated reactant. It shall be understood that a purge can be effected either in time or in space, or both. For example, in the case of temporal purges, a purge step can be used, e.g., in the temporal sequence of providing a precursor to a reactor chamber, ceasing a flow of the precursor, and providing a purge gas to the reaction chamber, wherein the substrate on which a layer is deposited does not move. In the case of spatial purges, a purge step can take the following form: moving a substrate from a first location to which a precursor is supplied, through a purge gas curtain, to a second location to which a plasma gas is supplied.

As used herein, silicon nitride refers to a material that includes silicon and nitrogen. Silicon nitride can be represented by the formula $Si_3N_4$. In some cases, the silicon nitride may not include stoichiometric silicon nitride. In some cases, the silicon nitride can include other elements, such as carbon, hydrogen, or the like.

As used herein, the term metal halide can refer to a material that includes a metal atom (e.g., a transition metal, such as tantalum, titanium, zirconium, or hafnium) and a halogen atom (e.g., one or more of fluorine (F), chlorine (Cl), bromine (Br), or iodine (I)). A metal halide can include two or more same or different metal atoms and/or two or more same or different halogen atoms.

As used herein, a metal nitride refers to a material that includes a metal and nitrogen. Metal nitrides may or may not include stoichiometric metal nitride. In some cases, the metal nitride can include other elements, such as carbon, hydrogen, or the like.

As used herein, the term overlap can mean coinciding with respect to time and within a reaction chamber. For example, two or more periods in a timing sequence overlap if there is a period of time in which both periods are being performed (e.g., within a reaction chamber).

Further, in this disclosure, any two numbers of a variable can constitute a workable range of the variable, and any ranges indicated may include or exclude the endpoints. Additionally, any values of variables indicated (regardless of whether they are indicated with about or not) may refer to precise values or approximate values and include equivalents, and may refer to average, median, representative, majority, or the like in some embodiments. Further, in this disclosure, the terms include, including, constituted by and having can refer independently to typically or broadly comprising, consisting essentially of, or consisting of in some embodiments. In this disclosure, any defined meanings do not necessarily exclude ordinary and customary meanings in some embodiments.

Methods of depositing material onto a surface of a substrate, in accordance with examples of the disclosure, include providing the substrate onto a susceptor within a reaction chamber of a reactor, flowing a gas-phase precursor within the reaction chamber, condensing the precursor onto the surface of the substrate to form condensed material, and curing the condensed material to transform the condensed material to cured material.

The substrate can include any substrate as described herein. By way of examples, the substrate can include a surface comprising a gap. The gap can have an aspect ratio as described herein.

A reaction chamber used during a method described herein can be or include a reaction chamber of a chemical vapor deposition reactor system configured to perform a cyclical deposition process. The reaction chamber can be a standalone reaction chamber or part of a cluster tool. An exemplary suitable reaction chamber is discussed in more detail below in connection with FIG. 5.

The step of flowing a gas-phase precursor within the reaction chamber can include heating a precursor to a temperature T1 prior to entering the gas-phase reactor. The precursor can, in some cases, be a liquid or solid at normal temperature and pressure and can become a gas at increased temperature and/or reduced pressure.

A substrate support or susceptor can be at (e.g., controlled to) a temperature T2 during the step of flowing the gas-phase precursor within the reaction chamber. In accordance with examples of the disclosure, T2 is lower than T1 and T2 is at or lower than a condensation temperature of the precursor for a pressure within the reaction chamber. By way of examples, T2 can be less than 50° C. or less than 45° C., or less than 30° C., or between about 0° C. and 50° C. or between about 0° C. and 45° C. T1 can be greater than 50° C. or greater than 65° C., or greater than 60° C., or between about 50° C. and 200° C. or between about 65° C. and 200° C. Additionally or alternatively, T1 can be about 20° C. to about 150° C. or between about 10° C. and about 150° C. higher than T2. A pressure within the reaction chamber during the step of flowing the gas-phase precursor within the reaction chamber can be between about 400 Pa and about 1000 Pa. In some cases, a temperature of a wall of the reaction chamber at a temperature can also be controlled— e.g., using one or more heaters and/or one or more cooling channels. A temperature of the wall of the reaction chamber can be controlled to a temperature T3, wherein T3 is greater than T2. In some cases, T3 may be less than T1. Additionally, a temperature of a gas distribution device (e.g., a showerhead) can be greater than T2 and, in some cases, less than T1.

The steps of flowing a gas-phase precursor within the reaction chamber and condensing the precursor onto the surface of the substrate to form condensed material can overlap. For example, because T2 is less than T1, the precursor can begin to condense at the precursor contacts or is proximate the substrate or substrate support. A temperature of the precursor, the substrate support, and a pressure within the reaction chamber can therefore be the same as described above in connection with the step of flowing the gas-phase precursor within the reaction chamber.

Various materials can be deposited onto the substrate surface using a method as described herein. In some cases, the material can be or include a conductive material, such as a metal nitride. In some cases, the material can be or include a semiconductive material, such as amorphous silicon.

A precursor provided during the step of flowing a gas-phase precursor within the reaction chamber can depend on the material to be deposited. In accordance with examples of the disclosure, the precursor can include one or more of silicon and a metal. In some cases, the gas-phase precursor comprises carbon. In some cases, the precursor can include one or more of a metal halide, an alkylamino compound, and a methyl compound. By way of specific examples, the precursor can be selected from one or more of the group consisting of tetrakis-dimethylaminotitanium (TDMAT), titanium tetrachloride, Silacore bis-diethylaminosilane (BDEAS), tetrakis(dimethylamido)zirconium (TDMAZr), tris(dimethylamino)cyclopentadienyl-zirconium, tetrakis (dimethylamido)hafnium (TDMAHf), and tris(dimethylamino)cyclopentadienyl-hafnium.

The precursor can be flowed to the reaction chamber with the aid of a carrier gas. The carrier gas can be or include an inert gas as described herein. A precursor with a carrier gas flow rate may be in a range of about 500 to about 5000 sccm. A duration of precursor pulse period 212 can range from about 0.05 to about 20 seconds or about 5 to about 15 seconds. The gas comprising the carrier gas and the precursor gas can comprise about 5% to about 10% precursor.

During the step of curing the condensed material to transform the condensed material to cured material, condensed material that forms during the step of condensing the precursor onto the surface of the substrate is cured or hardened—e.g., from a liquid or semi-liquid phase to a solid phase.

In accordance with examples of the disclosure, the step of curing the condensed material includes forming a plasma. The plasma can be or include a direct plasma or an indirect plasma, such as a remote plasma. A plasma power used to form the plasma can be, for example, greater than 200 W or between about 200 W and about 500 W. A duration of a plasma on-time can be greater than 0 and less than 5 seconds or between about 0.1 and 0.5 seconds. A frequency of power used to form the plasma can be between about 50 kHz and about 2.45 GHz or between about 13 MHz and about 14 MHz or about 26 MHz and about 28 MHz.

A temperature of the substrate support during the step of curing the condensed material can be as noted above or can be different. For example, the temperature of the substrate support can, in some cases, be 10° C. [higher or lower] during the step of curing the condensed material, compared to a temperature of the substrate support during the step of condensing the precursor onto the surface of the substrate.

In accordance with further examples of the disclosure, the method can further include flowing a purge, plasma, and/or reactant (generally referred to as a reactant) gas to the reaction chamber. In some cases, the purge, plasma, and reactant gas can include the same gas, which may be activated using the plasma. In some cases, the purge, plasma, and/or reactant gas can include a noble gas, such as argon or helium. Additionally or alternatively, the purge, plasma, and/or reactant gas can include one or more reactants selected from the group consisting of nitrogen ($N_2$), hydrogen ($H_2$), hydrazine, a hydrazine derivative, and any combination thereof. Exemplary hydrazine derivative include e.g., hydrazine, where each of the one to four substituents can be independently selected from H and a C1-C4 alkyl group.

The purge, plasma, and/or reactant gas can be continuously flowed during one or more steps of condensing the precursor onto the surface of the substrate and curing the condensed material to transform the condensed material to cured material. A reactant gas flowrate can be in a range of about 50 to about 5000 sccm. A duration of the reactant pulse period can be continuous during one or more deposition cycles.

FIG. 1 illustrates a timing sequence 100 suitable for use with a method as described herein. As illustrated, timing sequence 100 includes a precursor pulse period 102, a continuous purge, plasma, and/or reactant gas period 104, a plasma power pulse period 106, and a repeat loop 108. As used herein, pulse period or continuous period means a period in which a gas (e.g., precursor, reactant, inert gas, and/or carrier gas) is flowed to a reaction chamber and/or a period in which power is applied (e.g., power to produce a plasma). A height and/or width of the illustrated pulse period is not necessarily indicative of a particular amount or duration of a pulse. Exemplary parameters for pulse or continuous periods 102-106 are provided above.

In the illustrated example, a gas-phase precursor is provided to the reaction chamber for precursor pulse period 102, a continuous purge, plasma, and/or reactant gas is provided to the reaction chamber for a continuous period 104, and a plasma power is applied for a plasma power period 106. In accordance with examples of the disclosure, pulse periods 102 and 106 do not overlap in time and space.

Timing sequence 100 can also include a first purge period 110 and a second purge period 112. First purge period 110 may desirably be sufficiently long to allow the precursor to condense and flow within the gap on the substrate surface, but not so long as to remove all of the precursor from the reaction chamber prior to plasma power period 106. A flowrate of purge, plasma, and/or reactant gas during purge period 110 can be as described above. A duration of purge period 110 can be, for example, between 0.1 and 200 or between 0.1 and 50 seconds. Similarly, a flowrate of purge, plasma, and/or reactant gas during purge 112 can be as described above. A duration of purge period 112 can be, for example, between 0.1 and 200 or between 0.1 and 50 seconds.

Figure 2:
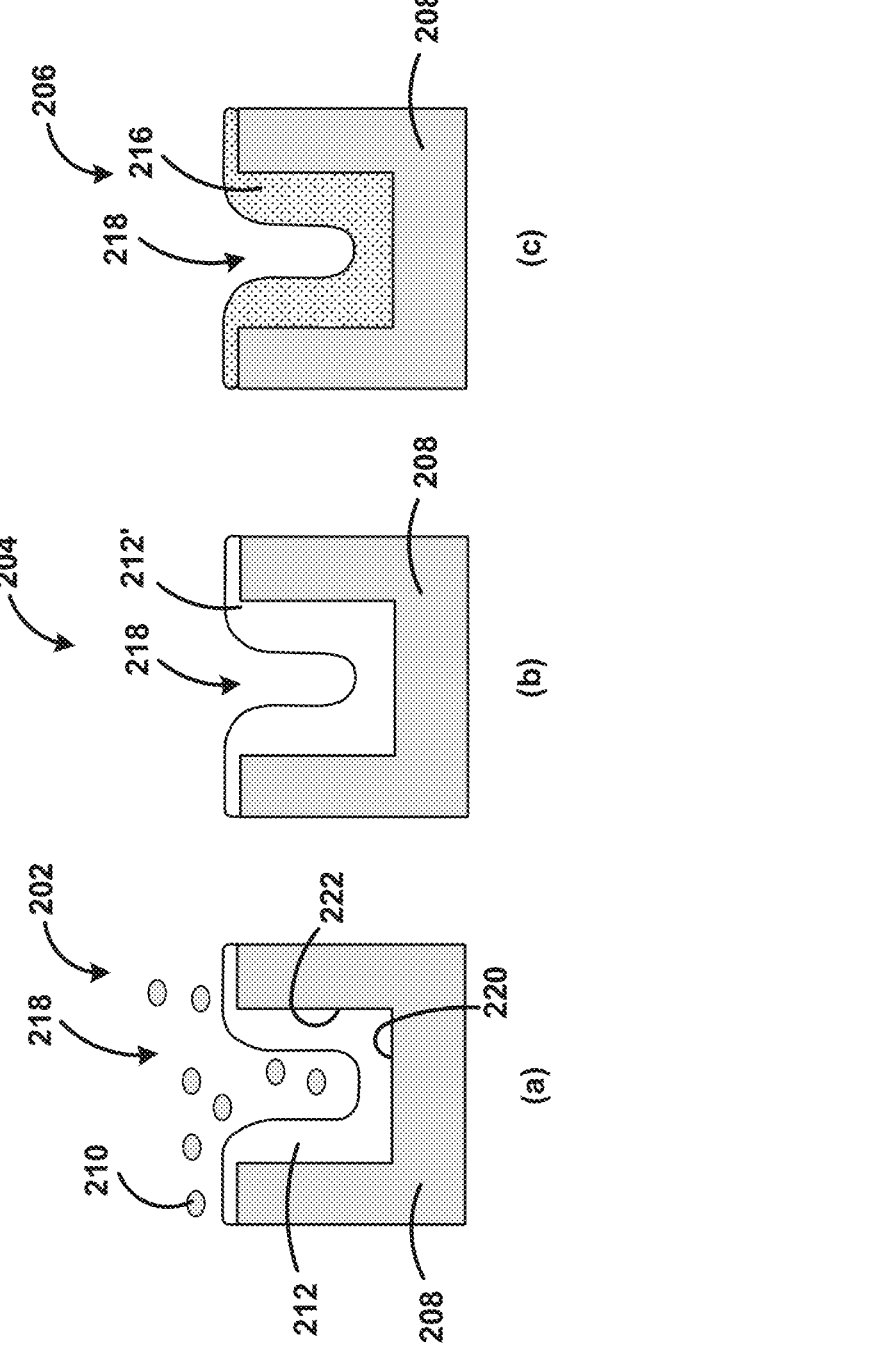
FIG. 2 illustrates structures in accordance with embodiments of the disclosure.

FIG. 2 illustrates structures 202, 204, and 206 that can be formed using a method as described herein. In particular, FIG. 2(a) illustrates structure 202 that includes a substrate 208 having a gap 218 formed therein. Gap 218 can include a bottom 220 and a sidewall 222. During the steps of flowing a gas-phase precursor within the reaction chamber and condensing the precursor onto the surface of the substrate, a precursor 210 condenses onto a surface within gap 218— e.g., on bottom 220 and sidewall 222 to form condensed material 212. As condensed material 212 continues to form, condensed material can flow within gap 218 and form condensed material 212', as illustrated in FIG. 2(b). Condensed material 212' can be the same or similar as condensed material 212, except gap 218 may include more condensed material 212' than condensed material 212 because of the flow of the condensed material. During the step of curing the condensed material to transform the condensed material to cured material, cured material 216 is formed within gap 218.

Figure 3:
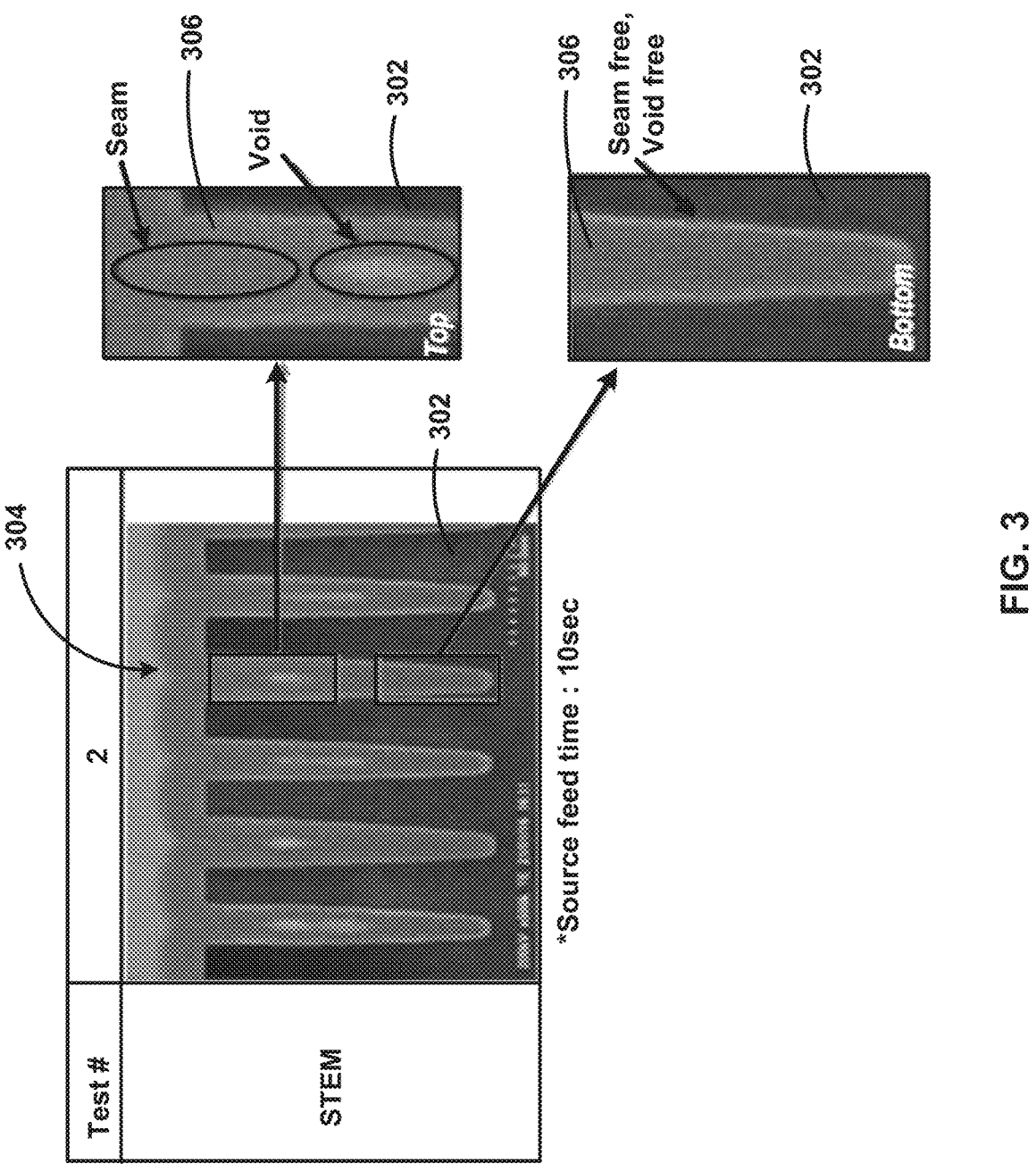
FIG. 3 illustrates scanning transmission electron microscopy (STEM) images of structures in accordance with the disclosure.

FIG. 3 illustrates a scanning transmission electron microscopy image of cured material 306 formed within a gap 304 formed within a substrate 302. As illustrated, a seam and void may form in an upper region of gap 304. However, no seam or void forms within a lower region of gap 304. The lower region can form the lower two thirds, lower one half, or lower one third of gap 304.

Figure 4:
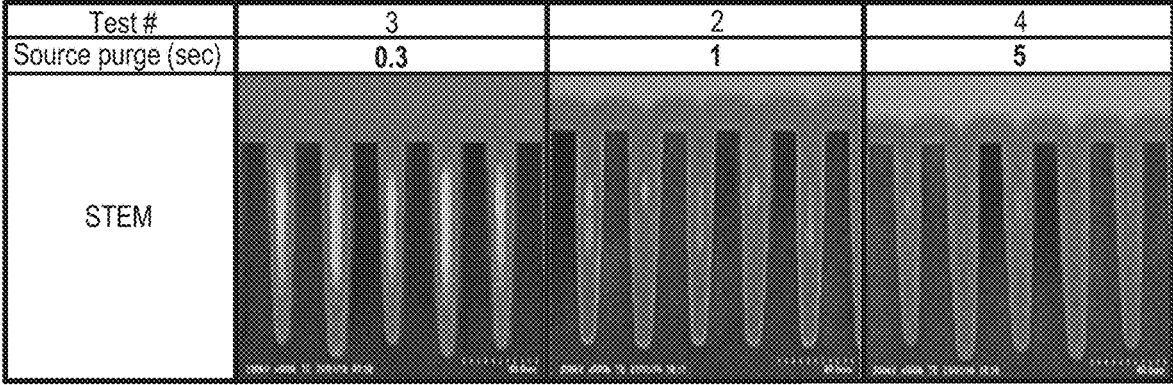
FIG. 4 illustrates additional structures, exemplary process conditions, and exemplary composition of cured material in accordance with examples of the disclosure.

FIG. 4 illustrates additional scanning transmission electron microscopy images of structures formed in accordance with examples of the disclosure. Exemplary process conditions and cured material compositions are also provided. The images illustrate that void and seam formation can be reduced by increasing a purge time (e.g., purge period 110) to at least one second and/or using a relatively high plasma power (e.g., greater than 200 W) during the step of curing.

As illustrated in FIG. 4, cured material (e.g., formed using TDMAT as a precursor) can include less than 30 at % or less than 25 at % carbon. In contrast, material formed using the same precursor using a traditional technique of first polymerizing a precursor to cause deposition and flow of the material can include greater than 40 or 50 at % carbon.

Figure 5:
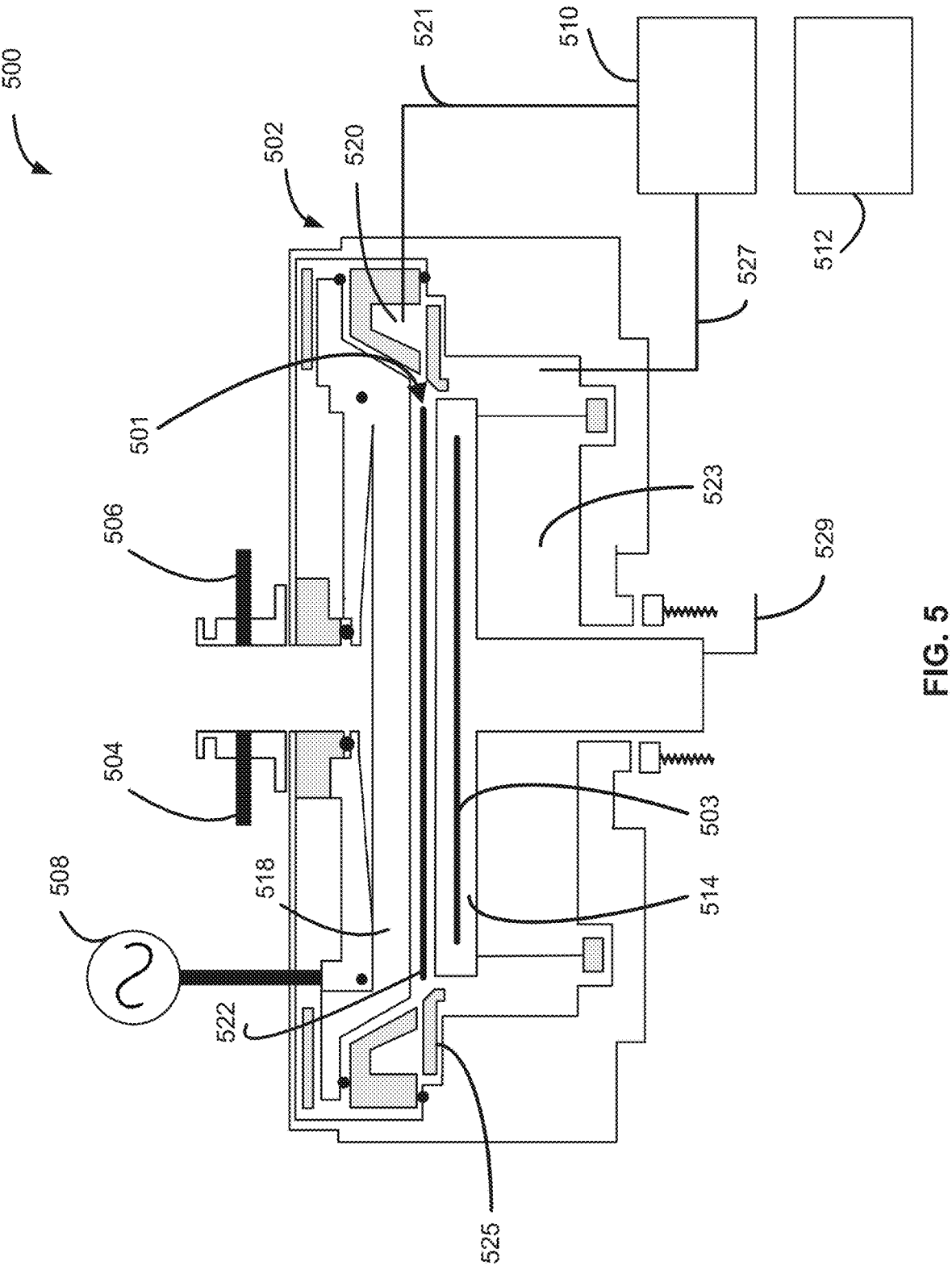
FIG. 5 illustrates a system in accordance with at least one embodiment of the disclosure.

Turning now to FIG. 5, a reactor system 500 in accordance with exemplary embodiments of the disclosure is illustrated. Reactor system 500 can be used to perform one or more steps or substeps as described herein and/or to form one or more structures or portions thereof as described herein.

Reactor system 500 includes a pair of electrically conductive flat-plate electrodes 514, 518 typically in parallel and facing each other in an interior 501 (reaction zone) of a reaction chamber 502. Although illustrated with one reaction chamber 502, reactor system 500 can include two or more reaction chambers. A plasma can be excited within interior 501 by applying, for example, RF power from plasma power source(s) 508 to one electrode (e.g., electrode 518) and electrically grounding the other electrode (e.g., electrode 514). A temperature regulator 503 (e.g., to provide heat and/or cooling) can be provided in a lower stage 514 (the lower electrode), and a temperature of a substrate 522 placed thereon can be kept at a desired temperature, such as the temperatures noted above. Electrode 518 can serve as a gas distribution device, such as a shower plate or showerhead. Precursor gases, reactant gases, and a carrier or inert gas, if any, or the like can be introduced into reaction chamber 502 using one or more gas lines (e.g., reactant gas line 504 and precursor gas line 506, respectively, coupled to a reactant source and a precursor source). For example, an inert gas and a reactant (e.g., as described above) can be introduced into reaction chamber 502 using line 504 and/or a precursor and a carrier gas (e.g., as described above) can be introduced into the reaction chamber using line 506. Although illustrated with two inlet gas lines 504, 506, reactor system 500 can include any suitable number of gas lines.

In reaction chamber 502, a circular duct 520 with an exhaust line 521 can be provided, through which gas in the interior 501 of the reaction chamber 502 can be exhausted to an exhaust source 510. Additionally, a transfer chamber 523 can be provided with a seal gas line 529 to introduce seal gas into the interior 501 of reaction chamber 502 via the interior (transfer zone) of transfer chamber 523, wherein a separation plate 525 for separating the reaction zone and the transfer chamber 523 can be provided (a gate valve through which a substrate is transferred into or from transfer chamber 523 is omitted from this figure). Transfer chamber 523 can also be provided with an exhaust line 527 coupled to an exhaust source 510. In some embodiments, continuous flow of a carrier gas to reaction chamber 502 can be accomplished using a flow-pass system (FPS).

Reactor system 500 can include one or more controller(s) 512 programmed or otherwise configured to cause one or more method steps as described herein to be conducted. Controller(s) 512 are coupled with the various power sources, heating systems, pumps, robotics and gas flow controllers, or valves of the reactor, as will be appreciated by the skilled artisan. By way of example, controller 512 can be configured to control gas flow of a precursor, a reactant, and/or an inert gas into at least one of the one or more reaction chambers to form a cured material as described herein. Controller 512 can be further configured to provide power to form a plasma—e.g., within reaction chamber 502. Controller 512 can be similarly configured to perform additional steps as described herein.

Controller 512 can include electronic circuitry and software to selectively operate valves, manifolds, heaters, pumps and other components included in system 500. Such circuitry and components operate to introduce precursors, reactants, and purge gases from the respective sources. Controller 512 can control timing of gas pulse sequences, temperature of the substrate and/or reaction chamber, pressure within the reaction chamber, plasma power, and various other operations to provide proper operation of the system 500, such as in the performance of timing sequence 100.

Controller 512 can include control software to electrically or pneumatically control valves to control flow of precursors, reactants, and/or purge gases into and out of the reaction chamber 502. Controller 512 can include modules, such as a software or hardware component, e.g., a FPGA or ASIC, which performs certain tasks. A module can advantageously be configured to reside on the addressable storage medium of the control system and be configured to execute one or more processes.

In some embodiments, a dual chamber reactor (two sections or compartments for processing substrates disposed close to each other) can be used, wherein a reactant gas and a noble gas can be supplied through a shared line, whereas a precursor gas is supplied through unshared lines.

During operation of system 500, substrates, such as semiconductor wafers, are transferred from, e.g., a substrate handling area 523 to interior 501. Once substrate(s) are transferred to interior 501, one or more gases, such as precursors, reactants, carrier gases, and/or purge gases, are introduced into reaction chamber 502.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

The invention claimed is:

1. A method of depositing material onto a surface of a substrate, the method comprising:

provided the substrate onto a susceptor within a reaction chamber of a reactor, the substrate surface comprising a gap;

flowing a gas-phase precursor within the reaction chamber, the gas-phase precursor heated to a temperature T1 prior to entering the gas-phase reactor;

condensing the precursor onto the surface of the substrate to form condensed material; and curing the condensed material to transform the condensed material to cured material, wherein a temperature T2 of the susceptor during the step of condensing is less than T1, and wherein the cured material consists essentially of one or more of conductive material or semiconductive material.

2. The method of claim 1, wherein the condensed material is a liquid.

3. The method of claim 1, wherein the condensed material flows within the gap prior to the step of curing.

4. The method of claim 1, wherein the precursor comprises one or more of silicon and a metal.

5. The method of claim 1, wherein the precursor comprises one or more of a metal halide, an alkylamino compound, and a methyl compound.

6. The method of claim 1, wherein the precursor is selected from the group consisting of tetrakis-dimethylaminotitanium (TDMAT), titanium tetrachloride, Silacore, bis-diethylaminosilane (BDEAS), tetrakis(dimethylamido)zirconium (TDMAZr), tris(dimethylamino)cyclopentadienyl-zirconium, tetrakis(dimethylamido)hafnium (TDMAHf), and tris(dimethylamino)cyclopentadienyl-hafnium.

7. The method of claim 1, wherein a pressure within the reaction chamber during the step of condensing the precursor onto the surface of the substrate is between about 400 Pa and about 1000 Pa.

8. The method of claim 1, wherein T2 is less than 50° C.

9. The method of claim 1, wherein T1 is greater than 50° C.

10. The method of claim 1, wherein the step of curing comprises forming a plasma.

11. The method of claim 10, wherein the step of forming a plasma comprises forming a direct plasma.

12. The method of claim 10, wherein the step of forming a plasma comprises providing a plasma power of greater than 200 W.

13. The method of any of claim 1, further comprising flowing a reactant into the reaction chamber.

14. The method of claim 13, wherein the reactant is selected from one or more reactants selected from the group consisting of nitrogen ($N_2$), hydrogen ($H_2$), hydrazine, a hydrazine derivative, and any combination thereof.

15. The method of claim 13, wherein the reactant is continuously flowed during one or more steps of condensing the precursor onto the surface of the substrate and curing the condensed material to transform the condensed material to cured material.

16. The method of claim 1, further comprising a step of maintaining a temperature of a wall of the reaction chamber at a temperature T3, wherein T3 is greater than T2.

17. The method of claim 1, wherein the cured material comprises less than 30 at % carbon.

18. The method of claim 1, wherein the gas-phase precursor comprises carbon.

19. A structure comprising deposited material formed according to the method of claim 1.

20. A reactor system to perform a method according to claim 1.

\* \* \* \* \*